(12) United States Patent
Jin et al.

(10) Patent No.: US 7,113,043 B1
(45) Date of Patent: Sep. 26, 2006

(54) ACTIVE BIAS CIRCUIT FOR LOW-NOISE AMPLIFIERS

(75) Inventors: Xiaodong Jin, Sunnyvale, CA (US); Shuran Wei, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 5 days.

(21) Appl. No.: 10/868,064

(22) Filed: Jun. 16, 2004

(51) Int. Cl.
*H03G 3/10* (2006.01)

(52) U.S. Cl. ........................ 330/279; 330/285; 330/290
(58) Field of Classification Search ................ 330/279, 330/285, 290
See application file for complete search history.

(56) References Cited

U.S. PATENT DOCUMENTS

| | | | |
|---|---|---|---|
| 5,339,046 A * | 8/1994 | Kornfeld et al. | ............ 330/277 |
| 5,923,217 A | 7/1999 | Durec | |
| 6,023,196 A | 2/2000 | Ashby et al. | |
| 6,046,642 A * | 4/2000 | Brayton et al. | ............. 330/296 |
| 6,114,912 A | 9/2000 | Ashby et al. | |
| 6,218,904 B1 * | 4/2001 | Panther | ...................... 330/296 |
| 6,392,490 B1 | 5/2002 | Gramegna et al. | |
| 6,429,746 B1 * | 8/2002 | Koukkari | ..................... 330/296 |
| 6,525,609 B1 * | 2/2003 | Behzad | ....................... 330/254 |
| 6,566,954 B1 | 5/2003 | Miyazawa | |
| 6,891,438 B1 * | 5/2005 | Arai et al. | ................... 330/296 |

FOREIGN PATENT DOCUMENTS

WO     WO 01/73958      3/2001

* cited by examiner

*Primary Examiner*—Patricia Nguyen

(57) ABSTRACT

A low-noise amplifier includes a first amplification device. The first amplification device includes a control terminal, a first terminal, and a second terminal. The low-noise amplifier also includes a feedback circuit in communication with the control terminal and the first terminal. The feedback circuit compares a voltage, corresponding to an output current associated with the first terminal, with a predetermined reference voltage to generate a bias signal applied to the control terminal for biasing the low-noise amplifier.

21 Claims, 2 Drawing Sheets

ACTIVE BIAS CIRCUIT FOR LOW-NOISE AMPLIFIERS

BACKGROUND

1. Field of the Invention

The present invention relates to integrated circuits. More particularly, the present invention relates to an active bias circuit for low-noise amplifiers.

2. Background Information

Typically, in low-noise amplifiers (LNAs) and the like, it is desirable to reduce the contribution of noise from any component as much as possible. In bipolar circuitry, for example, a bias current is applied to the base of the transistor that comprises the LNA. However, due to process variations, temperature, and the like, the $\beta$ of the transistor can vary by a factor of two, three, four or more. As a result of such varying transistor characteristics, the level of the bias current required to be applied to the transistor will change, resulting in a varying control of the gain of the LNA. Thus, under different conditions and varying transistor characteristics, the gain of the LNA can vary, which in most applications is unacceptable.

To address this problem, passive circuitry can be used to control the bias current applied to the transistor. For example, a diode device can be connected to the base electrode of the transistor. Such a diode device has an impedance proportional to $1/G_m$. For a 50$\Omega$ incoming signal, such an impedance can be too low, which can result in significant signal attenuation. In addition, any noise generated by the diode device and current sources connected to it will be transferred to and affect the rest of the LNA circuit.

Consequently, a biasing scheme is needed that is independent of process variations, temperature, variations in the $\beta$ of the transistor, and other like transistor characteristics.

SUMMARY OF THE INVENTION

A system and method are disclosed for actively controlling the bias of a low-noise amplifier (LNA). In accordance with exemplary embodiments, according to a first aspect of the present invention, a LNA includes a first amplification circuit. The first amplification circuit includes a control terminal, a first terminal, and a second terminal. The second terminal is in communication with a first reference voltage. The LNA includes an input circuit in communication with the control terminal and an output circuit in communication with the first terminal. The LNA includes an impedance load in communication with the output circuit and the first terminal. The LNA also includes a feedback circuit in communication with the control terminal and the impedance load. The feedback circuit includes a current source in communication with a second reference voltage. The feedback circuit includes a comparator circuit. The comparator circuit includes a first input, a second input and an output. The output is in communication with the control terminal. The feedback circuit includes a first impedance in communication with the current source and the first input. The first impedance is configured to generate a predetermined reference voltage corresponding to a predetermined reference current generated by the current source. The feedback circuit also includes a second impedance in communication with the second input and the impedance load. According to exemplary embodiments of the first aspect, he feedback circuit compares a voltage, corresponding to an output current associated with the first terminal, with the predetermined reference voltage to generate a bias signal applied to the control terminal for biasing the low-noise amplifier.

According to the first aspect, the first amplification circuit can comprise a bi-polar transistor. The control terminal of the first amplification circuit can comprise a base electrode, the first terminal of the first amplification circuit can comprise a collector electrode, and the second terminal of the first amplification circuit can comprise an emitter electrode. The input circuit can include, for example, a capacitive element. The capacitive element can receive an input signal. The LNA can include an isolation impedance in communication between the control terminal and the output of the comparator circuit. The isolation impedance can comprise, for example, a resistive element. The impedance load can comprise, for example, an inductive element. The LNA can include a second amplification circuit in communication between the output circuit and the first terminal of the first amplification circuit. The second amplification circuit can include a control terminal, a first terminal, and a second terminal. The first and second amplification circuits can be arranged in a cascode configuration. The second amplification circuit can comprise a bi-polar transistor. The control terminal of the second amplification circuit can comprise a base electrode, the first terminal of the second amplification circuit can comprise a collector electrode, and the second terminal of the second amplification circuit can comprise an emitter electrode.

According to the first aspect, the LNA can include a third reference voltage in communication with the control terminal of the second amplification circuit and each of the first and second impedances. The first and second impedances can comprise, for example, resistive elements. A value of the resistive element of the first impedance can be N times larger than a value of the resistive element of the second impedance. The feedback circuit can further include a third reference voltage in communication with the second impedance, the second input, and the impedance load. The third reference voltage can include a capacitive element, and a fourth reference voltage. According to an exemplary embodiment of the first aspect, the LNA can be formed on a monolithic substrate. The LNA can be compliant with a standard selected from the group consisting of I.E.E.E. 802.11, 802.11a, 802.11b, 802.11g, 802.11h, 802.11i and 802.11n, or any other suitable wireless or wired standard.

According to a second aspect of the present invention, a LNA formed on a monolithic substrate a first amplification circuit. The first amplification circuit includes a base electrode, a collector electrode, and an emitter electrode. The emitter electrode is in communication with a first reference voltage. The LNA includes an input circuit in communication with the base electrode. The LNA includes a first impedance element in communication with the input circuit and the base electrode. The LNA includes a second amplification circuit in communication with the collector electrode of the first amplification circuit. The second amplification circuit includes a base electrode, a collector electrode, and an emitter electrode. The first and second amplification circuits are arranged in a cascode configuration. The LNA includes an output circuit in communication with the collector electrode of the second amplification circuit, and a second impedance element in communication with the output circuit and the collector electrode of the second amplification circuit. The LNA also includes a feedback circuit in communication with the first and second impedance elements.

According to the second aspect, the feedback circuit includes a current source in communication with a second reference voltage and a comparator circuit. The comparator circuit includes a first input, a second input and an output. The output is in communication with the first impedance element. The feedback circuit includes a third impedance element in communication with the current source and the first input. The third impedance element is configured to generate a predetermined reference voltage corresponding to a predetermined reference current generated by the current source. The feedback circuit includes a fourth impedance element in communication with the second input and the second impedance element. The feedback circuit includes a third reference voltage in communication with the second and fourth impedance elements and the second input. The third reference voltage comprises a fifth impedance element and a fourth reference voltage. According to exemplary embodiments of the second aspect, the feedback circuit compares a voltage, corresponding to an output current associated with the collector electrode of the first amplification device, with the predetermined reference voltage to generate a bias signal applied to the base electrode of the first amplification device for biasing the low-noise amplifier.

According to the second aspect, the input circuit can include a capacitive element. The capacitive element can receive an input signal. The first, third and fourth impedance elements can comprise resistive elements. The second impedance element can comprise an inductive element. The fifth impedance element can comprise a capacitive element. The first and second amplification circuits can comprise bi-polar transistors. The LNA can include a fifth reference voltage in communication with the control terminal of the second amplification circuit and each of the third and fourth impedance elements. According to an exemplary embodiment of the second aspect, the LNA can be compliant with a standard selected from the group consisting of I.E.E.E. 802.11, 802.11a, 802.11b, 802.11g, 802.11h, 802.11i and 802.11n, or any other suitable wireless or wired standard.

BRIEF DESCRIPTION OF THE DRAWINGS

Other objects and advantages of the present invention will become apparent to those skilled in the art upon reading the following detailed description of preferred embodiments, in conjunction with the accompanying drawings, wherein like reference numerals have been used to designate like elements, and wherein.

DETAILED DESCRIPTION OF THE PREFERRED EMBODIMENTS

Exemplary embodiments of the present invention are directed to a system and method for actively controlling the bias of a low-noise amplifier (LNA). According exemplary embodiments, a feedback circuit in communication with the LNA is used. The feedback circuit senses the current in the LNA. The feedback circuit includes a comparator for comparing the sensed current with a reference current. The output of the comparator biases the input of the LNA by adjusting the current in the LNA until the LNA current reaches a predetermined level corresponding to the reference current. Exemplary embodiments of the present invention provide a means of biasing a LNA that is independent of process variations, transistor β variations, and other like variations in transistor characteristics.

Figure 1:
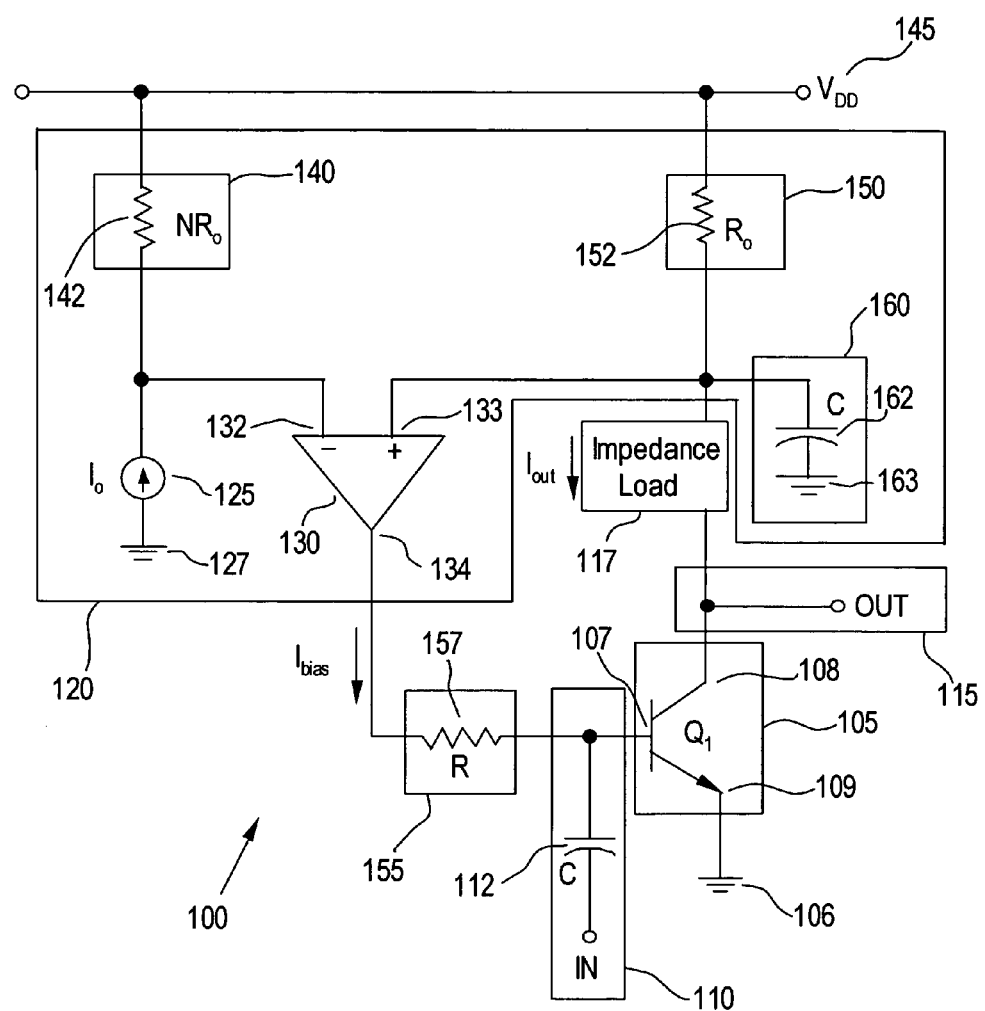
FIG. 1 is a circuit diagram illustrating a system for actively controlling a bias of a low-noise amplifier (LNA), in accordance with an exemplary embodiment of the present invention.

These and other aspects of the present invention will now be described in greater detail. FIG. 1 is a circuit diagram illustrating a system 100 for actively controlling a bias of a LNA, in accordance with an exemplary embodiment of the present invention. The system 100 includes a first amplification circuit 105. The first amplification circuit 105 includes a control terminal 107, a first terminal 108 and a second terminal 109. According to an exemplary embodiment, the first amplification circuit 105 can comprise a bi-polar transistor, such that control terminal 107 comprises a base electrode, first terminal 108 comprises a collector electrode, and second terminal 109 comprises an emitter electrode. For example, first amplification circuit 105 can be arranged in a single-ended common emitter configuration such that second terminal 109 is in communication with a reference voltage 106 (e.g., a ground or any suitable reference voltage).

The system 100 includes an input circuit 110 in communication with the control terminal 107 of the first amplification circuit 105. The input circuit 110 can comprise, for example, a capacitor 112, or any suitable impedance element or combination of impedance elements. The system 100 includes an output circuit 115 in communication with the first terminal 108 of the first amplification circuit 105. The system 100 also includes an impedance load 117 in communication with the output circuit 115 and the first terminal 108. The impedance load 117 can be any suitable impedance element or combination of impedance elements having any appropriate values.

The system 100 also includes a feedback circuit 120 in communication with the control terminal 107 and the impedance load 117. According to exemplary embodiments, the feedback circuit 120 compares a voltage, corresponding to an output current ($I_{OUT}$) associated with the first terminal 108, with a predetermined reference voltage to generate a bias signal. The bias signal is applied to the control terminal 107 for biasing the LNA.

According to exemplary embodiments, the feedback circuit 120 includes a current source 125, connected to a reference voltage 127 (e.g., a ground or any suitable reference voltage). The current source 125 generates a well-controlled and predetermined reference current 10 of any appropriate value The feedback circuit 120 includes a comparator circuit 130. The comparator circuit 130 includes a first input 132, a second input 133, and an output 134. The first input 132 can be, for example, the negative input of the comparator 130, while the second input 133 can be, for example, the positive input. The output 134 of the comparator 130 is in communication with the control terminal 107 of first amplification circuit 105. The feedback circuit 120 includes an impedance 140 in communication with the current source 125 and the first input 132. The impedance 140 is also in communication with a reference voltage 145, such as, for example, a DC power supply voltage ($V_{DD}$) or any suitable reference voltage. The impedance 140 is configured to generate the predetermined reference voltage corresponding to the predetermined reference current ($I_o$) generated by the current source 125. The feedback circuit 120 includes an impedance 150 in communication with the second input 133 of comparator 130 and the impedance load 117.

According to exemplary embodiments, the output current ($I_{out}$) associated with first terminal 108 of first amplification circuit 105 produces a voltage across impedance 150. Comparator 130 compares the voltage across impedance 140 with the voltage across impedance 150. The output 134 of comparator 130 will adjust the bias current ($I_{bias}$) applied to control terminal 107 of first amplification circuit 105 until the voltages across impedances 140 and 150 are equal. The impedances 140 and 150 can each be, for example, resistors, such as resistors 142 and 152, respectively. However, impedances 140 and 150 can be any suitable impedance element or combination of impedance elements of any appropriate values. According to an exemplary embodiment, the value of resistor 142 can be N times larger than the value of resistor 152, where N can be any number, although resistors 142 and 152 can be any appropriate value. Thus, the bias current $I_{bias}$ output by comparator 130 will adapt to equal $NI_o$.

The feedback circuit 120 includes a reference voltage 160 (e.g., an AC ground or any suitable reference voltage). The reference voltage 160 is in communication with impedance 150, the second input 133 of comparator 130 and the impedance load 117. The reference voltage 160 can include a capacitor 162, or any suitable impedance element or combination of impedance elements, and a reference voltage 163 (e.g., a ground or any suitable reference voltage). For example, the reference voltage 160 can be used to filter the reference voltage 145. The combination of reference voltage 160 and impedance 150 (when comprised of, for example, resistor 152) acts as a RC filter to reduce noise injection from the reference voltage 145.

The system 100 can include an impedance 155 in communication with the input circuit 110, the control terminal 107 of first amplification circuit 105, and the output 134 of comparator 130. The impedance 155 can comprise a resistor, such as resistor 157, or any suitable impedance element. The resistor of impedance 155 provides isolation. For example, according to an exemplary embodiment, the resistor 157 can be 100Ω and capacitor 112 can be 0.5 pF to match the input of the low gain mode to 50Ω. However resistor 157 and capacitor 112 can be of any appropriate values.

Figure 2:
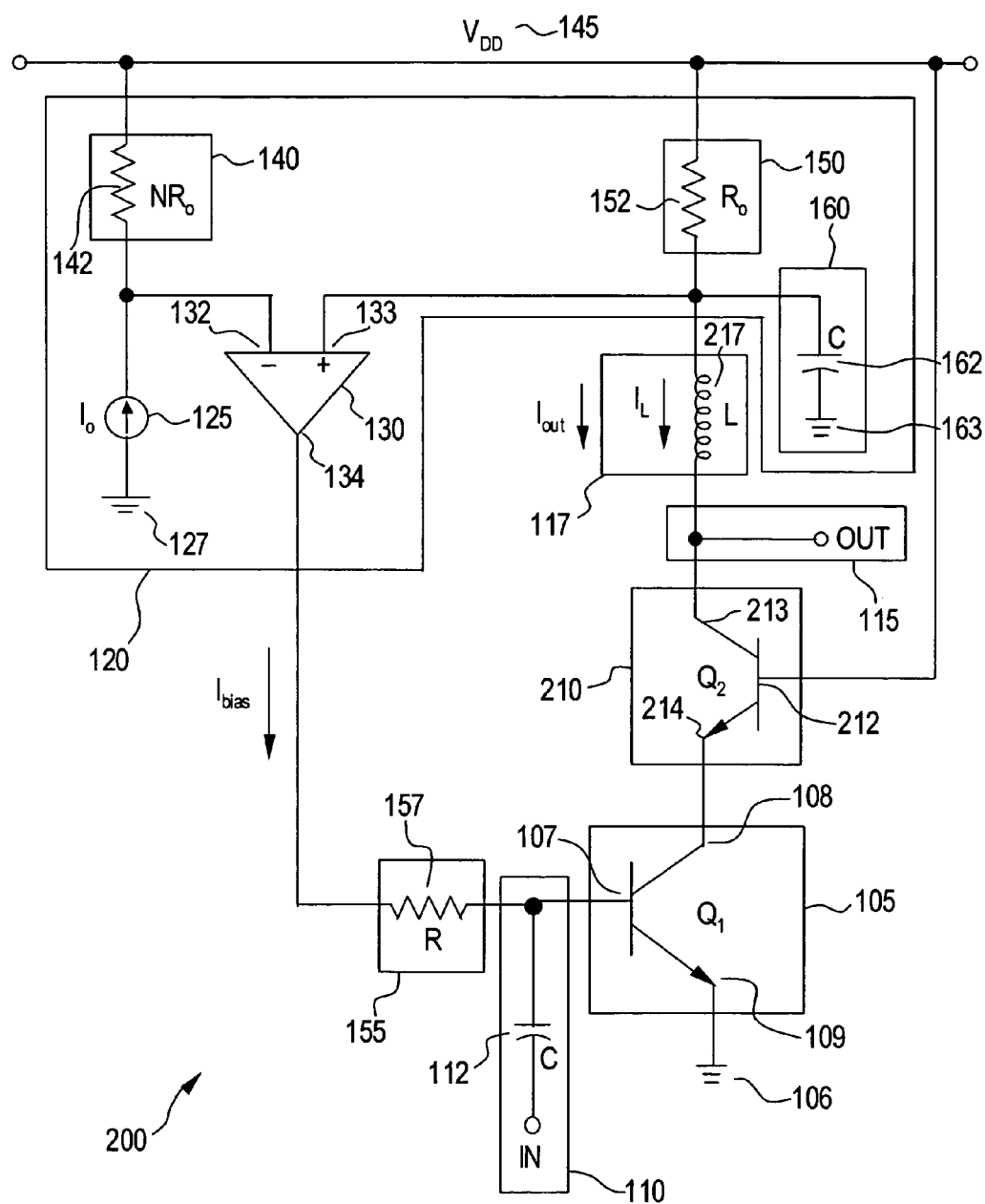
FIG. 2 is a circuit diagram illustrating a system for actively controlling a bias of a LNA, in accordance with an alternative exemplary embodiment of the present invention.

FIG. 2 is a circuit diagram illustrating a system 200 for actively controlling a bias of a LNA, in accordance with an alternative exemplary embodiment of the present invention. According to the alternative exemplary embodiment, the impedance load 117 can be, for example, an inductor, such as inductor 217. However, impedance load 117 can be any suitable impedance element or combination of impedance elements having any appropriate values. According to the alternative exemplary embodiment, the feedback circuit 120 will adjust the bias current $I_{bias}$ until the current ($I_L$) through inductor 217 reaches the desired level (i.e., $NI_o$). The system 200 can include a second amplification circuit 210 in communication between the output circuit 115 and the first terminal 108 of first amplification circuit 105. The second amplification circuit 210 includes a control terminal 212, a first terminal 213 and a second terminal 214. According to an exemplary embodiment, the second amplification circuit 210 can comprise a bi-polar resistor, such that control terminal 212 comprises a base electrode, first terminal 213 comprises a collector electrode, and second terminal 214 comprises an emitter electrode. For example, the second amplification circuit 210 can be arranged in a common base configuration, with the control terminal 212 of second amplification circuit 210 in communication with reference voltage 145. The first and second amplification circuits 105 and 210 are arranged in a cascode configuration. A cascode configuration improves stability and linearity and decreases distortion in the LNA by using the second amplification circuit 210 to shield the first amplification circuit 105 from voltage changes in the system 200 by improving reverse isolation.

According to an exemplary embodiment, first and second amplification circuits 105 and 210 can be a n-p-n or p-n-p bi-polar junction transistors. However, first and second amplification circuits 105 and 210 can be any suitable type of transistor, such as, for example, a field-effect transistor (FET), metal-oxide semiconductor FET (MOSFET), or the like. The reference voltage 145 for the systems 100 and 200 can be set at, for example, approximately 3V, or any other appropriate value. A regulated power supply can be used for the LNA to improve supply rejection. The input signal received on input circuit 110 can be any suitable type of electrical signal that is capable of communicating electrical information. The comparator 130 can be implemented using any suitable means for performing the functions associated with the component. For example, the comparator 130 can be an operational amplifier or the like.

The components of systems 100 and 200, or any combination thereof, can be formed on, for example, a monolithic substrate. Alternatively, each element, or any combination thereof, can be any suitable type of electrical or electronic component or device that is capable of performing the functions associated with the respective element. According to such an alternative exemplary embodiment, each component or device can be in communication with another component or device using any appropriate type of electrical connection that is capable of carrying electrical information. In addition, the systems 100 and 200 can be compliant with standards such as, for example, I.E.E.E. 802.11, 802.11a, 802.11b, 802.11g, 802.11h, 802.11i and 802.11n, or any other suitable wired or wireless standard.

Exemplary embodiments of the present invention can be used as at least part of a LNA or any other suitable type of amplifier or other circuit that requires biasing. For example, exemplary embodiments can be used in systems for communicating information over communication channels either wirelessly or by wired means. However, systems 100 and 200 can be used in any device or system that communicates information, including both wired and wireless communication systems, read channel devices, disk drive systems (e.g., those employing read channel devices), other magnetic storage or recording applications, and the like, particularly where an amplifier circuit or the like requires a biasing signal that is independent of process variations, transistor β variations, and other like variations in transistor characteristics.

It will be appreciated by those of ordinary skill in the art that the present invention can be embodied in various specific forms without departing from the spirit or essential characteristics thereof. The presently disclosed embodiments are considered in all respects to be illustrative and not restrictive. The scope of the invention is indicated by the appended claims, rather than the foregoing description, and all changes that come within the meaning and range of equivalence thereof are intended to be embraced.

All United States patents and applications, foreign patents, and publications discussed above are hereby incorporated herein by reference in their entireties.

What is claimed is:

1. A low-noise amplifier, comprising:
 a first amplification circuit,
  wherein the first amplification circuit includes a control terminal, a first terminal, and a second terminal, and
  wherein the second terminal is in communication with a first reference voltage;

an input circuit in communication with the control terminal;
an output circuit in communication with the first terminal;
an impedance load in communication with the output circuit and the first terminal; and
a feedback circuit in communication with the control terminal and the impedance load,
wherein the feedback circuit comprises:
a current source in communication with a second reference voltage;
a comparator circuit,
wherein the comparator circuit includes a first input, a second input and an output, and
wherein the output is in communication with the control terminal;
a first impedance in communication with the current source and the first input,
wherein the first impedance is configured to generate a predetermined reference voltage corresponding to a predetermined reference current generated by the current source; and
a second impedance in communication with the second input and the impedance load
wherein the feedback circuit compares a voltage, corresponding to an output current associated with the first terminal, with the predetermined reference voltage to generate a bias signal applied to the control terminal for biasing the low-noise amplifier.

2. The low-noise amplifier of claim 1, wherein the first amplification circuit comprises a bi-polar transistor,
wherein the control terminal of the first amplification circuit comprises a base electrode,
wherein the first terminal of the first amplification circuit comprises a collector electrode, and
wherein the second terminal of the first amplification circuit comprises an emitter electrode.

3. The low-noise amplifier of claim 1, wherein the input circuit comprises:
a capacitive element,
wherein the capacitive element receives an input signal.

4. The low-noise amplifier of claim 1, comprising:
an isolation impedance in communication between the control terminal and the output of the comparator circuit.

5. The low-noise amplifier of claim 4, wherein the isolation impedance comprises a resistive element.

6. The low-noise amplifier of claim 1, wherein the impedance load comprises an inductive element.

7. The low-noise amplifier of claim 1, comprising:
a second amplification circuit in communication between the output circuit and the first terminal of the first amplification circuit,
wherein the second amplification circuit includes a control terminal, a first terminal, and a second terminal,
wherein the first and second amplification circuits are arranged in a cascode configuration.

8. The low-noise amplifier of claim 7, wherein the second amplification circuit comprises a bi-polar transistor,
wherein the control terminal of the second amplification circuit comprises a base electrode,
wherein the first terminal of the second amplification circuit comprises a collector electrode, and
wherein the second terminal of the second amplification circuit comprises an emitter electrode.

9. The low-noise amplifier of claim 7, further comprising:
a third reference voltage in communication with the control terminal of the second amplification circuit and each of the first and second impedances.

10. The low-noise amplifier of claim 1, wherein the first and second impedances comprise resistive elements.

11. The low-noise amplifier of claim 10, wherein a value of the resistive element of the first impedance is N times larger than a value of the resistive element of the second impedance.

12. The low-noise amplifier of claim 1, wherein the feedback circuit further comprises:
a third reference voltage in communication with the second impedance, the second input, and the impedance load.

13. The low-noise amplifier of claim 12, wherein the third reference voltage comprises:
a capacitive element; and
a fourth reference voltage.

14. The low-noise amplifier of claim 1, wherein the low-noise amplifier is formed on a monolithic substrate.

15. The low-noise amplifier of claim 1, wherein the low-noise amplifier is compliant with a standard selected from the group consisting of I.E.E.E. 802.11, 802.11a, 802.11b, 802.11g, 802.11h, 802.11i and 802.11n.

16. A low-noise amplifier formed on a monolithic substrate, comprising:
a first amplification circuit,
wherein the first amplification circuit includes a base electrode, a collector electrode, and an emitter electrode, and
wherein the emitter electrode is in communication with a first reference voltage;
an input circuit in communication with the base electrode;
a first impedance element in communication with the input circuit and the base electrode;
a second amplification circuit in communication with the collector electrode of the first amplification circuit,
wherein the second amplification circuit includes a base electrode, a collector electrode, and an emitter electrode,
wherein the first and second amplification circuits are arranged in a cascode configuration,
an output circuit in communication with the collector electrode of the second amplification circuit;
a second impedance element in communication with the output circuit and the collector electrode of the second amplification circuit;
a feedback circuit in communication with the first and second impedance elements,
wherein the feedback circuit comprises:
a current source in communication with a second reference voltage;
a comparator circuit,
wherein the comparator circuit includes a first input, a second input and an output, and
wherein the output is in communication with the first impedance element;
a third impedance element in communication with the current source and the first input,
wherein the third impedance element is configured to generate a predetermined reference voltage corresponding to a predetermined reference current generated by the current source;
a fourth impedance element in communication with the second input and the second impedance element; and a third reference voltage in communication with the second and fourth impedance elements and the second input,
wherein the third reference voltage comprises a fifth impedance element and a fourth reference voltage,
wherein the feedback circuit compares a voltage, corresponding to an output current associated with the collector electrode of the first amplification device, with the predetermined reference voltage to generate a bias signal applied to the base electrode of the first amplification device for biasing the low-noise amplifier.

17. The low-noise amplifier of claim 16, wherein the input circuit comprises:
a capacitive element, wherein the capacitive element receives an input signal.

18. The low-noise amplifier of claim 16, wherein the first, third and fourth impedance elements comprise resistive elements,
wherein the second impedance element comprises an inductive element, and
wherein the fifth impedance element comprises a capacitive element.

19. The low-noise amplifier of claim 16, wherein the first and second amplification circuits comprise bi-polar transistors.

20. The low-noise amplifier of claim 16, wherein the low-noise amplifier comprises:
a fifth reference voltage in communication with the control terminal of the second amplification circuit and each of the third and fourth impedance elements.

21. The low-noise amplifier of claim 16, wherein the low-noise amplifier is compliant with a standard selected from the group consisting of I.E.E.E. 802.11, 802.11a, 802.11b, 802.11g, 802.11h, 802.11i and 802.11n.

* * * * *

UNITED STATES PATENT AND TRADEMARK OFFICE
CERTIFICATE OF CORRECTION

PATENT NO.         : 7,113,043 B1
APPLICATION NO.    : 10/868064
DATED              : September 26, 2006
INVENTOR(S)        : Xiaodong Jin et al.

It is certified that error appears in the above-identified patent and that said Letters Patent is hereby corrected as shown below:

Column 1, Line 65    Delete "he" and insert --the--
Column 2, Line 46    Insert --comprises-- between "substrate" and "a"
Column 3, Line 59    Insert --to-- after "According"
Column 4, Line 45    Delete "10" and insert --$I_o$--
Column 4, Line 46    Insert --.-- after "value"

Signed and Sealed this

Twenty-seventh Day of February, 2007

JON W. DUDAS
*Director of the United States Patent and Trademark Office*